United States Patent
Yang et al.

(10) Patent No.: US 8,013,446 B2
(45) Date of Patent: Sep. 6, 2011

(54) NITROGEN-CONTAINING METAL CAP FOR INTERCONNECT STRUCTURES

(75) Inventors: Chih-Chao Yang, Glenmont, NY (US); Chao-Kun Hu, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 12/190,277

(22) Filed: Aug. 12, 2008

(65) Prior Publication Data

US 2010/0038782 A1 Feb. 18, 2010

(51) Int. Cl.
 *H01L 23/48* (2006.01)
 *H01L 23/52* (2006.01)
 *H01L 29/40* (2006.01)
(52) U.S. Cl. . 257/758; 257/768; 257/769; 257/E23.169; 257/E21.575
(58) Field of Classification Search .......... 257/758, 257/768, 769
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,323,554 B1 | 11/2001 | Joshi et al. | |
| 6,342,733 B1 | 1/2002 | Hu et al. | |
| 6,441,492 B1 | 8/2002 | Cunningham | |
| 6,706,625 B1 | 3/2004 | Sudijono et al. | |
| 6,787,912 B2 | 9/2004 | Lane et al. | |
| 7,265,048 B2 | 9/2007 | Chung et al. | |
| 7,279,423 B2 | 10/2007 | Johnston et al. | |
| 2004/0113279 A1 | 6/2004 | Chen et al. | |
| 2005/0124154 A1 | 6/2005 | Park et al. | |
| 2005/0147762 A1* | 7/2005 | Dubin et al. | 427/437 |
| 2007/0246792 A1 | 10/2007 | Yang et al. | |

OTHER PUBLICATIONS

U.S. Appl. No. 11/766,261, filed Jun. 21, 2007, entitled, "Metal Cap With Ultra-Low k Dielectric Material for Circuit Interconnect Applications," first named inventor: Kenneth Parker.
U.S. Appl. No. 12/021,316, filed Jan. 29, 2008, entitled, "Noble Metal Cap for Interconnect Structures," first named inventor: Chih-Chao Yang.
U.S. Appl. No. 12/062,130, filed Apr. 3, 2008, entitled, "Surface Treatment for Selective Metal Cap Applications," first named inventor: Chih-Chao Yang.

\* cited by examiner

*Primary Examiner* — Thien F Tran
(74) *Attorney, Agent, or Firm* — Scully, Scott, Murphy & Presser, P.C.; Louis J. Percello, Esq.

(57) ABSTRACT

An interconnect structure is provided that has enhanced electromigration reliability without degrading circuit short yield, and improved technology extendibility. The inventive interconnect structure includes a dielectric material having a dielectric constant of about 3.0 or less. The dielectric material has at least one conductive material embedded therein. A nitrogen-containing noble metal cap is located predominately (i.e., essentially) on an upper surface of the at least one conductive region. The nitrogen-containing noble metal cap does not extend onto an upper surface of the dielectric material. In some embodiments, the nitrogen-containing noble metal cap is self-aligned to the embedded conductive material, while in other embodiments some portion of the nitrogen-containing noble metal cap extends onto an upper surface of a diffusion barrier that separates the at least one conductive material from the dielectric material. A method of fabricating such an interconnect structure utilizing a low temperature (about 200° C. or less) chemical deposition process is also provided.

18 Claims, 5 Drawing Sheets

NITROGEN-CONTAINING METAL CAP FOR INTERCONNECT STRUCTURES

RELATED APPLICATIONS

This application is related to co-pending U.S. application Ser. No. 11/766,261, filed Jun. 21, 2007, co-pending U.S. application Ser. No. 12/021,316, filed Jan. 29, 2008, and co-pending U.S. application Ser. No. 12/062,130, filed Apr. 3, 2008.

FIELD OF THE INVENTION

The present invention relates to a semiconductor interconnect structure and a method of fabricating the same. More particularly, the present invention relates to a semiconductor interconnect structure having enhanced electromigration (EM) reliability in which a nitrogen-containing noble metal cap is located predominately on a surface of a conductive material that is embedded within an interconnect dielectric material. A method of forming such an interconnect structure is also provided.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

Figure 1A:
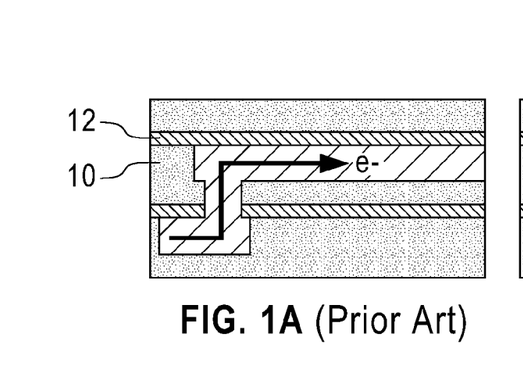
FIGS. 1A-1D are pictorial representations (through cross sectional views) illustrating the formation of a circuit dead opening in a prior art interconnect structure which is caused by EM failure.
Figure 1B:
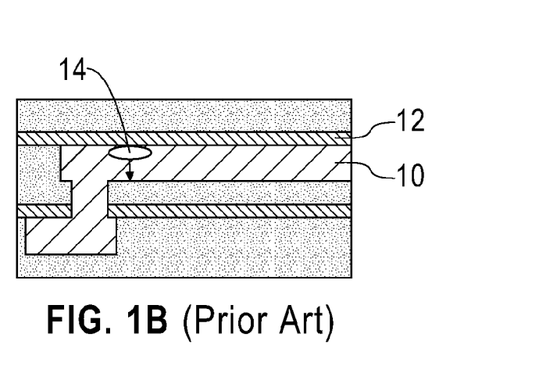
Figure 1C:
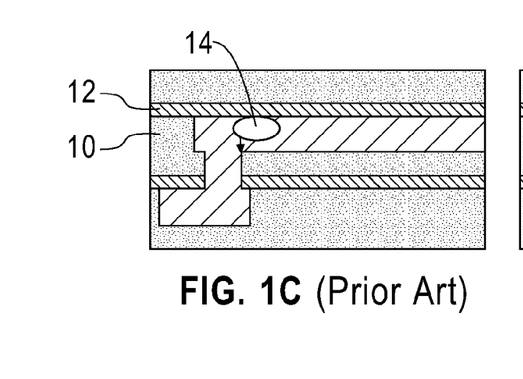
Figure 1D:
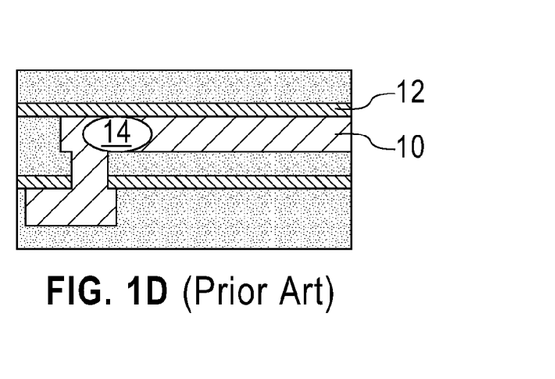

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1C is at a time when the void 14 grows towards the bottom of the conductive feature 10, and FIG. 1D is at a time in which the void 14 growth crosses the metal interconnect feature 10 causing a circuit dead opening.

Figure 2:
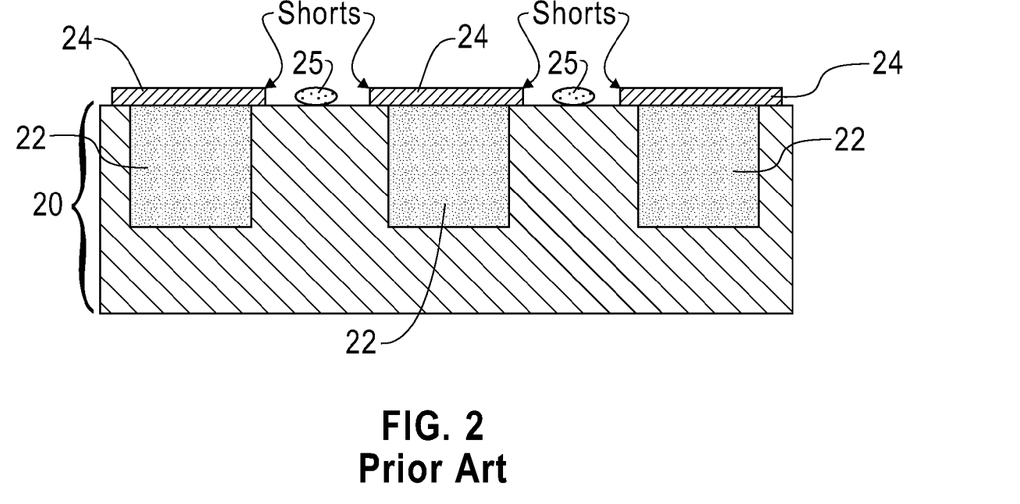
FIG. 2 is a prior art interconnect structure (through a cross sectional view) including a Co-containing alloy metal cap located atop a conductive material that is embedded with a dielectric material, and metal residues from the Co-containing alloy cap process are present on the dielectric surface.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap extends onto the adjoining surface of the interconnect dielectric material and, as such, electrical shorts between adjacent interconnects may arise. This is seen, for example, in FIG. 2 wherein reference numeral 20 denotes a dielectric material, reference numeral 22 denotes a conductive material embedded within the dielectric material 20, reference numeral 24 denotes a Co-containing alloy metal cap, and reference numeral 25 denotes metal residues from the Co-containing alloy cap process.

Figure 3:
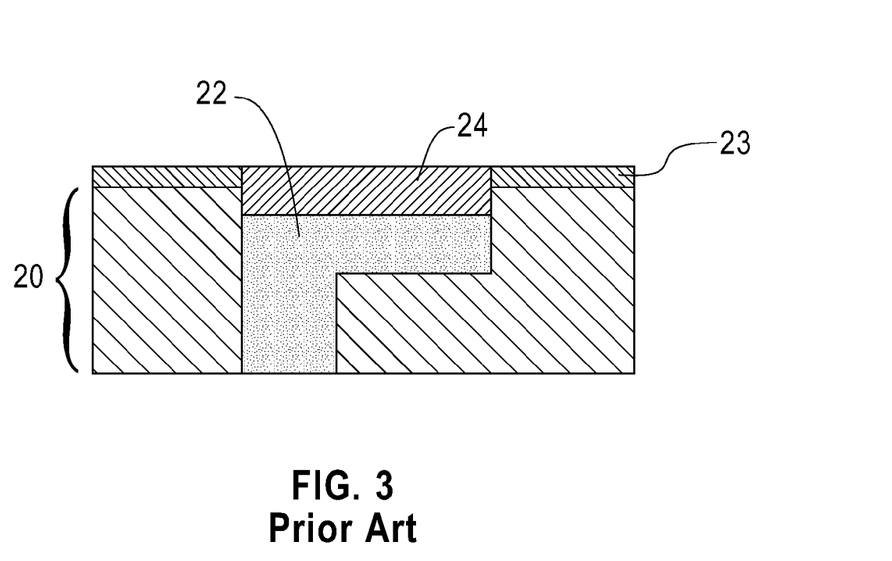
FIG. 3 is a prior interconnect structure (through a cross sectional view) including a recessed conductive material embedded within a dielectric material, said recessed conductive material having a metal capping layer located thereon.

In addition to the above, it is known to provide a metal cap directly on the surface of an interconnect conductive material, such as, for example, Cu, by recessing the interconnect conductive material below a surface of the interconnect dielectric material. Such a structure is shown, for example, in FIG. 3. In this figure, reference numeral 20 denotes the interconnect dielectric material, reference numeral 22 denotes the interconnect conductive material embedded within the dielectric material 20, reference numeral 23 denotes a dielectric cap, and reference numeral 24 denotes the metal cap. Although this prior art recess process provides a metal cap that is located only on a surface of the recessed conductive material, such a process is problematic since there is high process cost associated therewith.

It is also worth mentioning that during a clean in dilute hydrofluoric acid, which is generally used to clean the surface of the interconnect dielectric material, corrosion of metal caps may occur. This is particularly observed when CoWP is used as the metal cap material.

In addition to Co-containing metal caps mentioned above, Ru and other like noble metals have been used in the prior art as the material of the metal cap. Although Cu and other like noble metals have been successfully used in prior art interconnect structures, the applicants of the present application have determined through experimentation that Ru and other like noble metal caps are not an efficient oxygen diffusion barrier. As such, the conductive material that is embedded within an interconnect dielectric material that includes a Ru and other like noble metal cap may oxidize causing a decrease in the electromigration resistance of the interconnect structure.

In view of the above, there is a need for providing an interconnect structure which avoids a circuit dead opening caused by EM failure as well as electrical shorts between adjacent interconnect structures which are typically exhibited when prior art selectively deposited Co-containing metal caps are employed. Also, there is a need for providing an oxidation-resistant interconnect structure in which the problem associated with Ru and other like noble metal caps is avoided.

SUMMARY OF THE INVENTION

The present invention provides a semiconductor interconnect structure that has improved EM reliability. The present invention also provides a semiconductor interconnect structure in which electrical shorts between adjacent interconnect structures and the oxidization of the embedded interconnect conductive material are avoided. The present invention also provides an interconnect structure that has better reliability and technology extendibility for the semiconductor industry.

In particular, the present invention provides an interconnect structure in which a nitrogen-containing noble metal cap layer is present predominately (i.e., essentially) on an exposed upper surface of a non-recessed conductive material which is embedded within a low k dielectric material. That is, the nitrogen-containing noble metal cap layer is either self-aligned to the exposed upper surface of the non-recessed conductive material, or a portion thereof can extend onto an upper surface of an underlying U-shaped diffusion barrier. In both of these embodiments however, the nitrogen-containing noble metal cap does not extend onto a surface of the interconnect dielectric layer. In a preferred embodiment of the invention, no nitrogen-containing noble metal cap layer extends onto the diffusion barrier that separates the conductive material from the low k dielectric material.

The term "low k" is used throughout this application to denote an interconnect dielectric material having a dielectric constant of about 3.0 or less. The term "non-recessed conductive material" is used herein to denote a conductive material having an upper surface that is co-planar with an upper surface of the low k dielectric material. Applicants have determined that by providing a nitrogen-containing noble metal cap layer that is self-aligned to the upper surface of the non-recessed conductive material, a structure having better leakage control and improved EM resistance compared with prior art structures such as those described in the co-pending applications mentioned in the Related Applications section of this application is provided.

In general terms, the interconnect structure of the present invention includes:

a dielectric material having a dielectric constant of about 3.0 or less, the dielectric material having at least one conductive material embedded within the dielectric material, and the at least one conductive material having an upper surface that is co-planar with an upper surface of the dielectric material; and a nitrogen-containing noble metal cap located essentially on the upper surface of the at least one conductive material, the nitrogen-containing noble metal cap does not extend onto the upper surface of the dielectric material.

In the inventive structure, there is no "residues" from the nitrogen-containing noble metal cap deposited on the dielectric surface. By "residues" it is meant that no fragments of nitrogen-containing noble metal material form on the dielectric material surface.

The dielectric material which is present in the inventive interconnect structure may be any interconnect dielectric material having a dielectric constant of about 3.0 or less. Illustratively, the dielectric material employed in the present invention comprises a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as AlCu).

As mentioned above, the conductive material is separated from the dielectric material by a diffusion barrier. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

The term "nitrogen-containing noble metal" when referring to the cap located essentially on the at least one conductive material includes any metal layer that includes at least one region that includes nitrogen that is resistant to corrosion or oxidation. Examples of nitrogen-containing noble metal caps include a (1) a bilayer structure including a top layer of a nitrogen-containing noble metal; (2) a multilayered structure (including more than two layers) in which at least a top layer thereof includes a nitrogen-containing noble metal, e.g., RuN, (3) a single layered structure including a nitrogen-containing noble metal, or (4) a structure including a gradient concentration of nitrogen which increases from a lower surface upwards. The preferred noble metals that can be used in the present invention as the nitrogen-containing noble metal cap are selected from the group consisting of Ru, Ir, Rh, Pt, Co and alloys thereof. More preferably, the noble metal employed as the nitrogen-containing noble metal cap includes Ru or a Ru alloy. The term "alloy" is used to denote a mixture of noble metals as well as elements such as W, B and P.

In addition to the interconnect structure mentioned above, the present invention also provides a method of fabricating the same. In general terms, the inventive method includes:

providing a dielectric material having a dielectric constant of about 3.0 or less, the dielectric material having at least one conductive material embedded within the dielectric material, and the at least one conductive material has an upper surface that is co-planar with an upper surface of the dielectric material; and forming a nitrogen-containing noble metal cap essentially on the upper surface of the at least one conductive material, the nitrogen-containing noble metal cap does not extend onto the upper surface of the dielectric material, the nitrogen-containing noble metal cap forming does not result in nitrogen-containing noble metal residues on the upper surface of the dielectric material, and the forming includes a chemical deposition process that is performed at a temperature of about 200° C. or less.

DETAILED DESCRIPTION OF THE INVENTION

The present invention, which provides an interconnect structure having enhanced electromigration (EM) reliability without degrading circuit short yield and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "con" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure that includes a dielectric material having a dielectric constant of about 3.0 or less. This low k dielectric material has at least one conductive material having an upper surface embedded therein. A nitrogen-containing noble metal cap is located either directly on the upper surface of the at least one conductive material, or some portion thereof may extend onto an upper surface of an underlying U-shaped diffusion barrier. In a preferred embodiment of the invention, the nitrogen-containing noble metal cap is self-aligned to "i.e., located directly on" an upper surface of the conductive material. Because of the presence of the low k dielectric material and the low temperature deposition employed in forming the nitrogen-containing noble metal cap, the nitrogen-containing noble metal cap does not substantially extend onto an upper surface of a diffusion barrier that separates the at least one conductive material from the dielectric and no metal residues from the nitrogen-containing noble metal cap deposition form on the dielectric material surface. Moreover, since the cap layer of the present invention includes nitrogen, the interconnect structures of the present invention have improved EM resistance since the nitrogen-containing cap layer is an effective oxygen diffusion barrier and, as such, it prevents oxidation of the embedded conductive material. The improved EM resistance is compared to prior art structures including Co, and noble metal caps.

The present invention also provides a method of fabricating such an interconnect structure in which a low temperature chemical deposition process (temperature of about 200° C. or less) is used together with the low k dielectric material to selectively form a nitrogen-containing noble metal cap essentially atop the at least one conductive material (i.e., a conductive feature) of an interconnect structure.

Reference is first made to FIGS. 4A-4E which are pictorial representations (through cross sectional views) illustrating an exemplary interconnect structure of the present invention through various processing steps. In the process flow shown in these drawings, the nitrogen-containing noble metal cap is illustrated as being self-aligned to the underlying conductive material. Although this embodiment is described and illustrated, the present invention also contemplates an embodiment in which some portion of the nitrogen-containing noble metal cap extends onto an upper surface of an underlying U-shaped diffusion barrier. In no embodiments, does the inventive nitrogen-containing noble metal extend onto the dielectric material that embeds the conductive material.

Figure 4A:
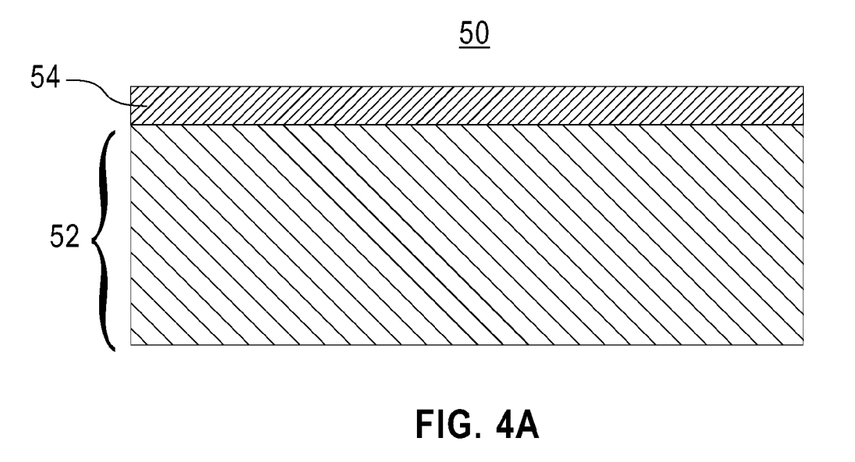
FIGS. 4A-4E are pictorial representations (through cross sectional views) illustrating an interconnect structure through various processing steps of the present invention.

Specifically, FIG. 4A illustrates an initial structure 50 that can be employed in the present invention in fabricating the inventive interconnect structure. The initial structure 50 includes a dielectric material 52 having a pad stack 54 located on an upper surface thereof.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 3.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectric layers within the dielectric material 52. Typically, and for normal interconnect structures, the dielectric material 52 has a thickness from about 50 to about 1000 nm.

The dielectric material 52 is formed utilizing any conventional deposition process including, but not limited to chemical vapor deposition (CVD), plasma enhanced chemical vapor deposition (PECVD), evaporation, chemical solution deposition and spin-on coating.

After forming the dielectric material 52, pad stack 54 is formed on an exposed upper surface of dielectric material 52. The pad stack 54 comprises an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition. In other embodiments, the pad stack 54 is formed by a thermal process such as, for example, a thermal oxidation, a thermal nitridation and/or a thermal oxynitridation process. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from about 10 to about 80 nm.

After forming the initial structure 50 shown in FIG. 4A, at least one opening 56 is formed into the dielectric material 52 utilizing the pad stack 54 as a pattern mask. The resultant structure including the at least one opening 56 is shown, for example, in FIG. 4B. The at least one opening 56 may include a via opening, a line opening, a combined via and line opening, or any combination thereof. In the drawings, three via openings are shown by way of a non-limiting example.

Figure 4B:
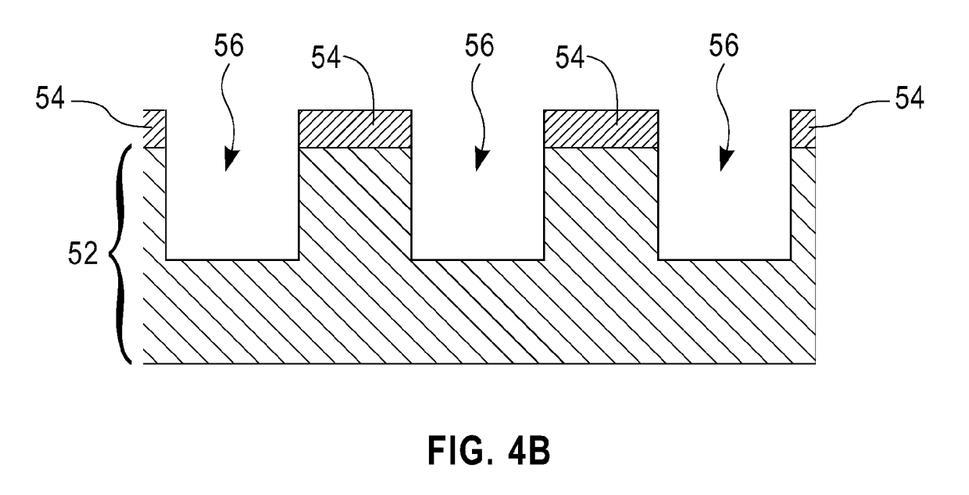

The at least one opening 56 is formed utilizing conventional lithography and etching. The lithographic step includes forming a photoresist (organic, inorganic or hybrid) atop the pad stack 54 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into first the pad stack 54 and then the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof Typically, reactive ion etching is used to form the at least one opening 56.

Figure 4C:
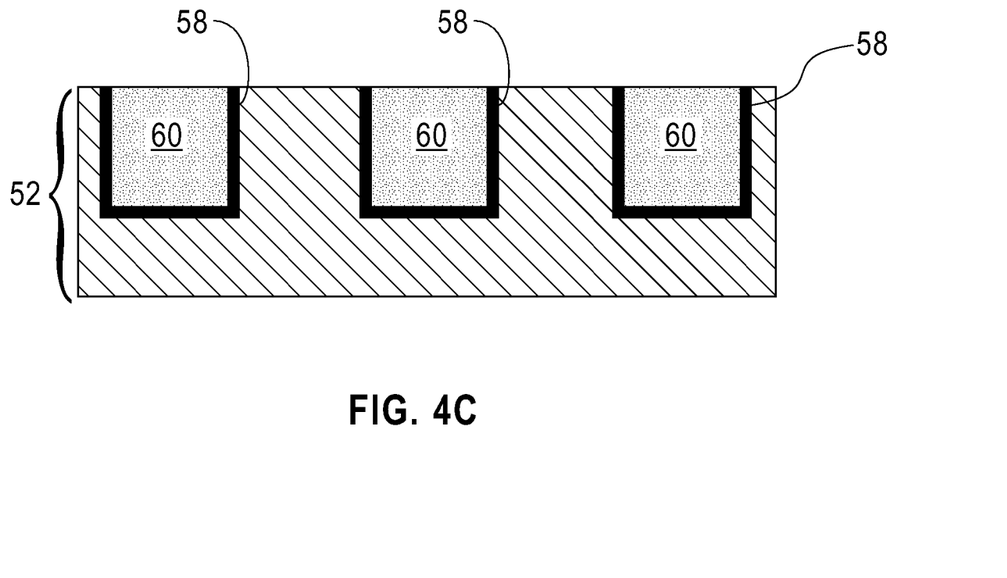

Next, and as shown in FIG. 4C, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from about 4 to about 40 nm, with a thickness from about 7 to about 20 nm being more typical.

The diffusion barrier 58, which is located between the conductive material 60 and the dielectric material 52 is formed by any conventional deposition process including, for example, CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 3C in which the upper surfaces of the dielectric material 52, the diffusion barrier 58 (which is now U-shaped) and the conductive material 60 are substantially coplanar with each other. It is noted that during the planarization process, the remaining pad stack 54 is removed from the structure.

Figure 4D:
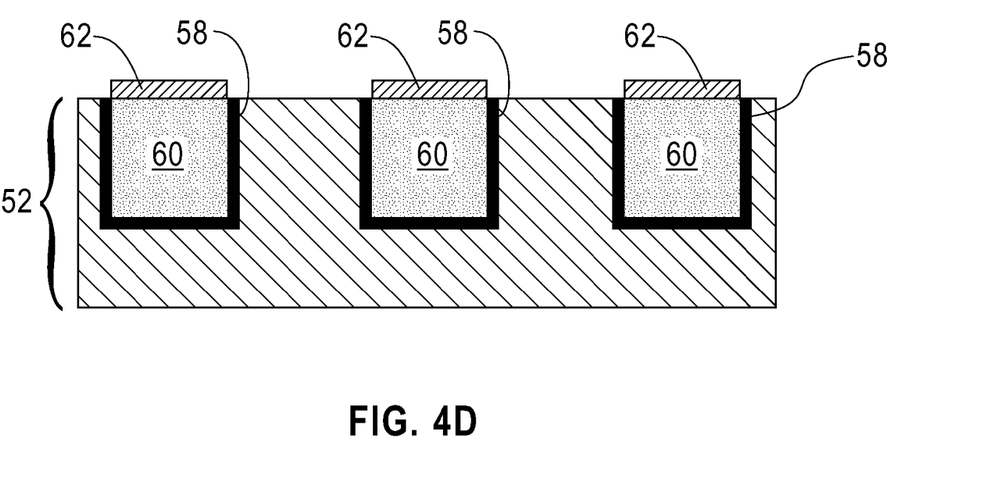

Next, and as is shown in FIG. 4D, a nitrogen-containing noble metal cap 62 is selectively formed essentially atop the conductive material 60. It is again observed that the embodiment shown in FIG. 4D represents a preferred embodiment of the present invention in which the nitrogen-containing noble metal cap is self-aligned to the underlying conductive material. Although this embodiment is shown, the inventive method and structure also contemplate an embodiment in which some portion of the nitrogen-containing noble metal cap may extend onto an upper surface of the underlying diffusion barrier. In the embodiments of the invention, no portion of the nitrogen-containing noble metal cap extends onto the surface of dielectric material 52. That is, no portion of the nitrogen-containing noble metal cap 62 (or residues thereof) is deposited (or form) on the dielectric material 52 surface.

The term "noble metal" when referring to the nitrogen-containing noble metal cap 62 located essentially atop the at least one conductive region (i.e., conductive material 60) includes any metal that is resistant to corrosion or oxidation. The preferred noble metals that can be used in the present invention as the nitrogen-containing noble metal cap are selected from the group consisting of Ru, Ir, Rh, Pt, Co and alloys thereof. The term "alloy" is used to denote a mixture of noble metals as well as elements such as W, B and P. More preferably, the noble metal employed as the noble metal cap comprises Ru or a Ru alloy. In some embodiments, the nitrogen-containing noble metal cap 62 includes a multilayered noble metal or noble metal alloy stack.

Figure 5A:
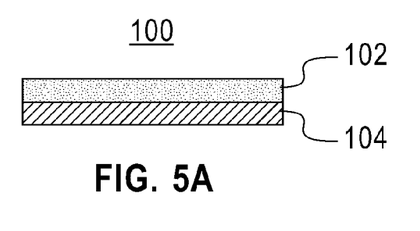
FIGS. 5A-5D are pictorial representations (through cross sectional views) illustrating various nitrogen-containing noble metal cap structures that can be used in the present invention.
Figure 5B:
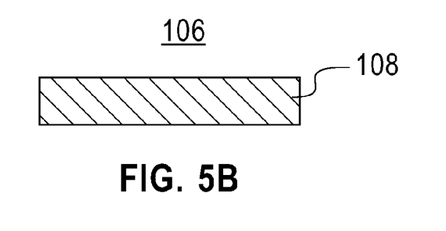
Figure 5C:
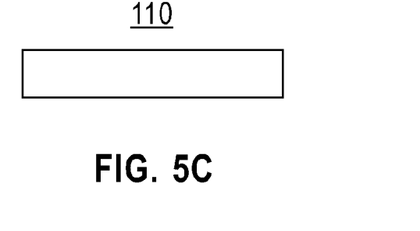
Figure 5D:
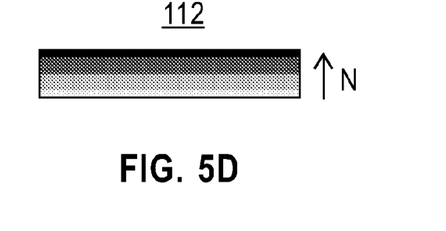

As stated above, the term "nitrogen-containing noble metal" when referring to the cap located essentially atop the at least one conductive material includes any metal layer that includes at least one region that includes nitrogen that is resistant to corrosion or oxidation. Examples of nitrogen-containing noble metal caps include a bilayer structure 100 including a top layer 102 of a nitrogen-containing noble metal, the bottom layer 104 can be comprised of a noble metal, See FIG. 5A; a multilayered structure (including more than two layers) 106 in which at least a top layer 108 thereof includes a nitrogen-containing noble metal, e.g., RuN, the other layers (not specifically labeled could be any combination of noble metal and nitrogen-containing noble metal, See FIG. 5B; a single layered structure 10 including a nitrogen-containing noble metal, See FIG. 5C; or (4) a structure 112 including a gradient concentration of nitrogen which increases from a lower surface upperwards, See FIG. 5D. The noble metal within the multilayered or bilayer structures can be the same or different, with the same type of noble metal being highly preferred.

The thickness of the nitrogen-containing noble metal cap 62 may vary depending on the type of noble metal present in the cap, the deposition technique and conditions used as well as the number of noble metals within the cap. Typically, the nitrogen-containing noble metal cap 62 has a thickness from about 1 to about 100 Å, with a thickness from about 5 to about 50 Å being more highly preferred.

The nitrogen-containing noble metal cap 62 is formed utilizing a low temperature chemical deposition process including, for example, CVD, PECVD, low pressure CVD and ALD. By "low temperature", it is meant a deposition temperature of about 200° C. or less, with a deposition temperature of less than about 150° C. being even more preferred. The deposition conditions are selected to provide a deposition rate of the nitrogen-containing noble metal cap 62 onto the conductive material 60 that is from about 0.2 to about 0.8 Å/sec. In some embodiments of the present invention, a low temperature deposition is used in forming a noble metal-containing layer and a nitrogen-containing layer. In yet other embodiments, the low temperature deposition is used in forming a noble metal layer and a nitridation process is used in forming the nitrogen-containing surface region of the nitrogen-containing cap. In yet another embodiment, nitrogen is added in increasing concentrations during the deposition of the nitrogen-containing noble metal cap. In yet another embodiment, alternating low temperature depositions of noble metal and a nitrogen-containing noble metal are performed.

It is again emphasized that the applicants have determined that the selective deposition of the nitrogen-containing noble metal cap predominately atop the conductive material 60 (some portion of the nitrogen-containing noble metal cap may extend onto a surface of the underlying diffusion barrier) is enhanced by utilizing a low k dielectric material 52, with k about 3.0 or less, as well as a low temperature chemical deposition process. These two factors are critical in the present invention to avoid forming the nitrogen-containing noble metal cap onto the dielectric material 52.

After selectively forming the nitrogen-containing noble metal cap 62 predominately onto conductive material 60, a dielectric capping layer 64 is formed across the entire structure shown in FIG. 4D. The resultant structure including the dielectric capping layer 64 is shown, for example, in FIG. 4E. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof The thickness of the dielectric capping layer 64 may vary depending on the technique used to form the same as well as the material make-up of the layer. Typically, the dielectric capping layer 64 has a thickness from about 15 to about 100 nm, with a thickness from about 25 to about 45 nm being more typical.

Figure 4E:
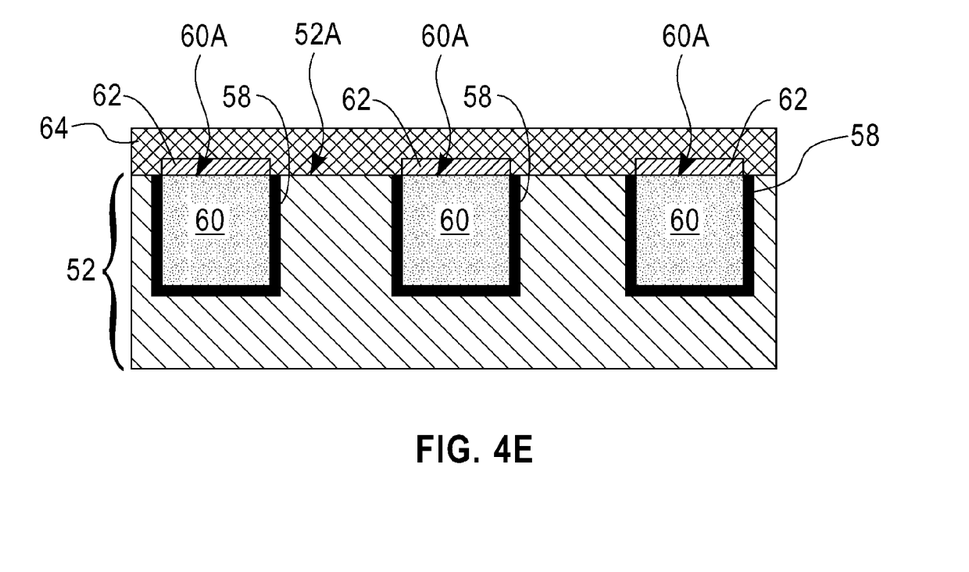

The dielectric capping layer 64 is formed utilizing any conventional deposition process including, for example, CVD, PECVD, evaporation, spin-on coating and chemical solution deposition.

FIG. 4E illustrates an interconnect structure in accordance with an embodiment of the present invention. Specifically, the inventive interconnect structure includes a dielectric material 52 having a dielectric constant of about 3.0 or less. The dielectric material 52 has at least one conductive region (represented by conductive material 60) embedded within the dielectric material 52, said at least one conductive region having an upper surface. A nitrogen-containing noble metal cap 62 is located directly on the upper surface of the at least one conductive region (i.e., conductive material 60). It is again emphasized that the structure illustrated in FIG. 4E is a preferred embodiment of the invention. The invention also contemplates an alternative structure in which some portion of the nitrogen-containing noble metal cap extends onto an upper surface of an underlying diffusion barrier. In no instances however does the nitrogen-containing noble metal cap extend onto an upper surface of dielectric material 52. Because of the presence of the low k dielectric material and the low temperature chemical deposition process used in forming the nitrogen-containing noble metal cap, the nitrogen-containing noble metal cap 62 does not extend onto an upper surface of the dielectric material 52. Also, no residues of the noble metal form of the surface of the dielectric material 52. In FIG. 4E, reference numeral 60A represents the upper surface of the conductive material 60.

Applicants have determined that the inventive interconnect structure shown in FIG. 4E has better leakage control than prior art interconnect structures in which the metal cap extends onto the diffusion barrier that separates the embedded conductive material from the dielectric material. Also, applicants have determined that the inventive interconnect structure shown in FIG. 4 has increased EM resistance since the inventive nitrogen-containing noble metal cap prevents oxidation of the underlying conductive material more readily than a prior art interconnect structure in which the metal cap is composed of a noble metal or noble metal alloy.

Although the structure shown in FIG. 4E has better leakage control, applicants also contemplate an alternative structure in which some portion of the nitrogen-containing noble metal cap extends onto an upper surface of the U-shaped diffusion barrier. In this alternative structure, no portion of the nitrogen-containing noble metal cap or residues thereof are formed onto the dielectric material.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
a dielectric material having a dielectric constant of about 3.0 or less, said dielectric material having at least one conductive material embedded within said dielectric material, said at least one conductive material having an upper surface that is co-planar with an upper surface of the dielectric material; and
a nitrogen-containing noble metal cap located essentially on said upper surface of said at least one conductive material, said nitrogen-containing noble metal cap does not extend onto said upper surface of said dielectric material and no nitrogen-containing noble metal residues are present on the upper surface of said dielectric material, wherein said nitrogen-containing noble metal cap is selected from the group consisting of a bilayer structure including a top layer of a nitrogen-containing noble metal and a bottom layer consisting of at least one noble metal, a multilayered structure including more than two layers in which at least a top layer thereof includes a nitrogen-containing noble metal and a bottom layer thereof consists of at least one noble metal, and a structure including a gradient concentration of nitrogen which increases from a lower surface upwards.

2. The interconnect structure of claim 1 wherein said nitrogen-containing noble metal cap includes said bilayer structure.

3. The interconnect structure of claim 1 wherein said at least one noble metal is selected from the group consisting of Ru, Ir, Rb, Pt, and Co.

4. The interconnect structure of claim 3 wherein said nitrogen-containing noble metal cap is self-aligned to said conductive material.

5. The interconnect structure of claim 1 further comprising a dielectric capping layer located atop said dielectric material and said nitrogen-containing noble metal cap, said dielectric capping layer is selected from the group consisting of SiC, Si$_4$NH$_3$, SiO$_2$, a carbon doped oxide, a nitrogen and hydrogen doped silicon carbide SiC(N,H) and multilayers thereof.

6. The interconnect structure of claim 1 wherein said at least one conductive material comprises polySi, a conductive metal, a conductive metal alloy, a conductive metal silicide or combinations and multilayers thereof.

7. The interconnect structure of claim 6 wherein said at least one conductive material is a conductive metal selected from one of Cu, W and Al.

8. The interconnect structure of claim 7 wherein said at least one conductive material is Cu or a Cu alloy.

9. The interconnect structure of claim 1 wherein said dielectric material comprises a silsesquioxane, a C doped oxide that includes at least atoms of Si, C, O and H, a thermosetting polyarylene ether, or multilayers thereof.

10. The interconnect structure of claim 1 wherein said nitrogen-containing noble metal cap is said multilayered structure.

11. The interconnect structure of claim 1 wherein said nitrogen-containing noble metal cap is said structure including the gradient concentration of nitrogen which increases from the lower surface upwards.

12. An interconnect structure comprising:
a dielectric material having a dielectric constant of about 3.0 or less, said dielectric material having at least one Cu-containing conductive material embedded within said dielectric material, said at least one Cu-containing conductive material having an upper surface that is co-planar with an upper surface of said dielectric material; and
a RuN cap located essentially on said upper surface of said at least one Cu-containing conductive material, wherein said RuN cap does not extend onto an upper surface of said dielectric material and no RuN residues are present on the upper surface of said dielectric material, and wherein said RuN cap is selected from the group consisting of a bilayer structure including a top layer of RuN and a bottom layer consisting of Ru, a multilayered structure including more than two layers in which at least a top layer thereof includes RuN and a bottom layer thereof consists of Ru, and a structure including Ru having a gradient concentration of nitrogen which increases from a lower surface upwards.

13. The interconnect structure of claim 12 further comprising a dielectric capping layer located atop said dielectric material and said RuN cap, wherein said dielectric capping layer is selected from the group consisting of SiC, Si$_4$NH$_3$, SiO$_2$, a carbon doped oxide, a nitrogen and hydrogen doped silicon carbide SiC(N,H) and multilayers thereof.

14. The interconnect structure of claim 12 wherein said RuN cap includes said bilayer structure.

15. The interconnect structure of claim 12 wherein said RuN cap is self-aligned to said at least one Cu-containing conductive material.

16. The interconnect structure of claim 12 wherein said dielectric material comprises a silsesquioxane, a C doped oxide that includes at least atoms of Si, C, O and H, a thermosetting polyarylene ether, or multilayers thereof.

17. The interconnect structure of claim 12 wherein said RuN cap is said multilayered structure.

18. The interconnect structure of claim 12 wherein said RuN cap is said structure including Ru having the gradient concentration of nitrogen which increases from the lower surface upwards.

* * * * *